(12) United States Patent
Park et al.

(10) Patent No.: US 11,621,389 B2
(45) Date of Patent: Apr. 4, 2023

(54) LOW FREQUENCY VIBRATING ACTUATOR DEVICE

(71) Applicant: ELECTRONICS AND TELECOMMUNICATIONS RESEARCH INSTITUTE, Daejeon (KR)

(72) Inventors: Kang-Ho Park, Daejeon (KR); Seongdeok Ahn, Daejeon (KR); Jong Tae Lim, Seoul (KR); Chan Woo Park, Daejeon (KR); Ji-Young Oh, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 442 days.

(21) Appl. No.: 17/023,730

(22) Filed: Sep. 17, 2020

(65) Prior Publication Data

US 2021/0126182 A1 Apr. 29, 2021

(30) Foreign Application Priority Data

Oct. 28, 2019 (KR) .................. 10-2019-0134859
Mar. 23, 2020 (KR) .................. 10-2020-0035159

(51) Int. Cl.
 *H01L 41/047* (2006.01)
 *H01L 41/053* (2006.01)
 *H01L 41/083* (2006.01)

(52) U.S. Cl.
 CPC .......... *H01L 41/047* (2013.01); *H01L 41/053* (2013.01); *H01L 41/083* (2013.01)

(58) Field of Classification Search
 CPC ..... H01L 41/053; H01L 41/047; H01L 41/083
 USPC ................................... 310/328, 329
 See application file for complete search history.

(56) References Cited

U.S. PATENT DOCUMENTS

| 9,142,857 B2 | 9/2015 | Lee et al. |
| 9,445,200 B2 | 9/2016 | Kim et al. |
| 9,793,463 B2 | 10/2017 | Son et al. |
| 2013/0041235 A1 | 2/2013 | Rogers et al. |
| 2014/0346928 A1* | 11/2014 | Jun ................ H02N 2/006 310/329 |

(Continued)

FOREIGN PATENT DOCUMENTS

| KR | 20110075429 A | 7/2011 |
| KR | 1020160007029 A | 1/2016 |

(Continued)

*Primary Examiner* — Derek J Rosenau
(74) *Attorney, Agent, or Firm* — Rabin & Berdo, P.C.

(57) ABSTRACT

Provided is a low frequency vibrating actuator device. The low frequency vibrating actuator device includes a substrate including a pair of connection electrodes, an actuator provided on the pair of connection electrodes to generate vibration, a support provided on the actuator, a vibration membrane provided on the support to vibrate according to the actuator, and a vibrating mass provided on the vibration membrane to vibrate according to the vibration membrane. The actuator includes a plurality of laminated insulating layers and internal electrodes that are alternately laminated between the insulating layers adjacent to each other, and a top surface of the support, which contacts the vibration membrane, has an area that is equal to or less than that of a bottom surface of the support, which contacts the actuator.

16 Claims, 20 Drawing Sheets

(56) References Cited

U.S. PATENT DOCUMENTS

2015/0188455 A1* 7/2015 Oh .................. B06B 1/0603
310/317

FOREIGN PATENT DOCUMENTS

| KR | 102026905 B1 | 11/2019 |
| KR | 1020200050094 A | 5/2020 |
| WO | 2017168793 A1 | 10/2017 |

* cited by examiner

LOW FREQUENCY VIBRATING ACTUATOR DEVICE

CROSS-REFERENCE TO RELATED APPLICATIONS

This U.S. non-provisional patent application claims priority under 35 U.S.C. § 119 of Korean Patent Application Nos. 10-2019-0134859 filed on Oct. 28, 2019, and 10-2020-0035159 filed on Mar. 23, 2020, the entire contents of which are hereby incorporated by reference.

BACKGROUND

The present disclosure herein relates to a low frequency vibrating actuator device, and more particularly, to a low frequency vibrating actuator device including a support and a vibrating mass having various shapes.

In general, a vibrating actuator device may be an actuator element that generates and transmits vibration using an electric motor, a piezoelectric element, an electrostrictive element, and a capacitive element. The vibrating actuator device may implement a function of transmitting vibration to fingertips, skins, and tissues within the body of a person or animal. The vibrating actuator device may be applied to various technical and industrial fields such as touch screen, tactile display, augmented reality (AR)/virtual reality (VR)/mixed reality (MR), and bio-diagnosis fields.

SUMMARY

The present disclosure provides a low frequency vibrating actuator device outputting a low frequency that is capable of being detected by a human.

Technical objects to be solved by the present invention are not limited to the aforementioned technical objects and unmentioned technical objects will be clearly understood by those skilled in the art from the specification and the appended claims.

An embodiment of the inventive concept provides a low frequency vibrating actuator device includes: a substrate including a pair of connection electrodes; an actuator provided on the pair of connection electrodes to generate vibration; a support provided on the actuator; a vibration membrane provided on the support to vibrate according to the actuator; and a vibrating mass provided on the vibration membrane to vibrate according to the vibration membrane, wherein the actuator includes a plurality of laminated insulating layers and internal electrodes that are alternately laminated between the insulating layers adjacent to each other, and a top surface of the support, which contacts the vibration membrane, has an area that is equal to or less than that of a bottom surface of the support, which contacts the actuator.

In an embodiment of the inventive concept, a low frequency vibrating actuator device includes: a lower substrate including a pair of connection electrodes; an actuator provided on the pair of connection electrodes to generate vibration; a first support provided on the actuator; a first vibration membrane provided on the first support; a vibrating mass provided on the first vibration membrane; a second vibration membrane provided on the vibrating mass; a second support provided on the second vibration membrane; and an upper substrate provided on the second support, wherein a top surface of the second support contacts the upper substrate, and the actuator has a resonant frequency greater than that of the vibrating mass.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
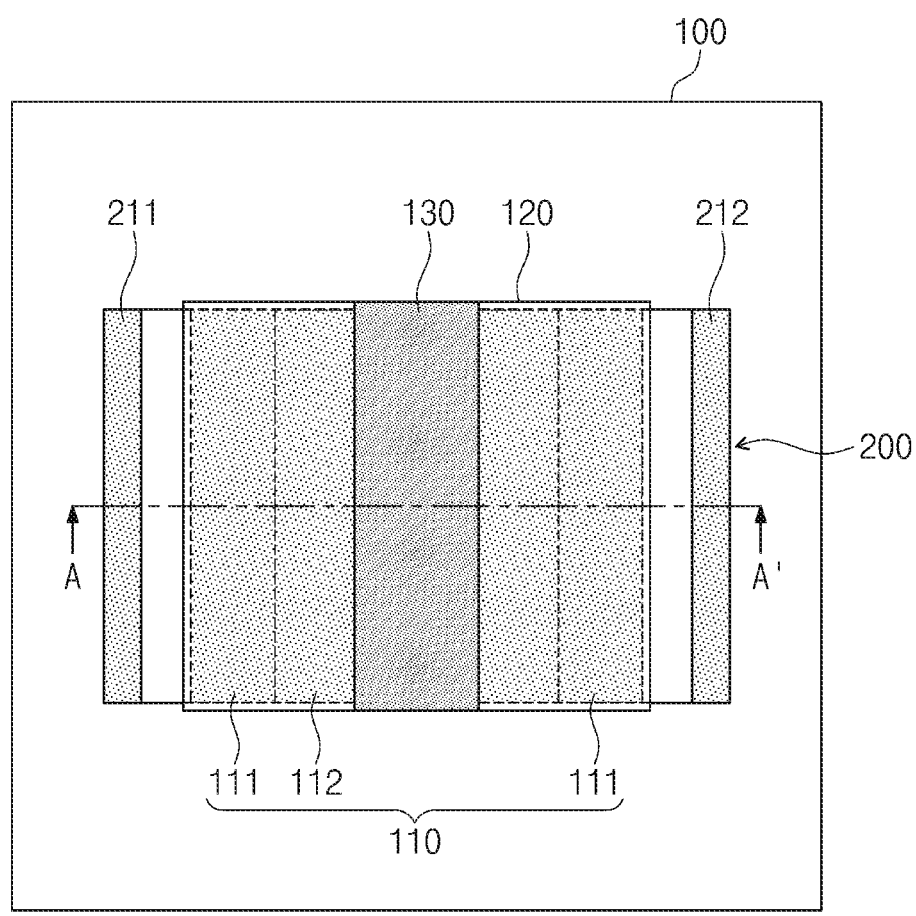
FIG. 1 is a plan view of a low frequency actuator device when viewed from an upper side according to embodiments of the inventive concept.

The present invention is not limited to the embodiments disclosed below, but should be implemented in various forms, and various modifications and changes may be made. Rather, these embodiments are provided so that this disclosure will be thorough and complete, and will fully convey the scope of the present invention to those skilled in the art. Further, the present invention is only defined by scopes of claims. In the accompanying drawings, the components are shown enlarged for the sake of convenience of explanation, and the proportions of the components may be exaggerated or reduced for clarity of illustration.

In the following description, the technical terms are used only for explaining a specific exemplary embodiment while not limiting the present invention. Unless terms used in embodiments of the present invention are differently defined, the terms may be construed as meanings that are commonly known to a person skilled in the art.

In the following description, the technical terms are used only for explaining a specific exemplary embodiment while not limiting the present invention. In this specification, the terms of a singular form may include plural forms unless specifically mentioned. The meaning of 'comprises' and/or 'comprising' specifies a component, a step, an operation and/or an element does not exclude other components, steps, operations and/or elements.

When a layer is referred to herein as being 'on' another layer, it may be formed directly on the top of the other layer or a third layer may be interposed between them.

It will be understood that although the terms first and second are used herein to describe various regions, layers, and the like, these regions and layers should not be limited by these terms. These terms are used only to discriminate one region or layer from another region or layer. Therefore, a portion referred to as a first portion in one embodiment can be referred to as a second portion in another embodiment. An embodiment described and exemplified herein includes a complementary embodiment thereof. Like reference numerals refer to like elements throughout.

Figure 2A:
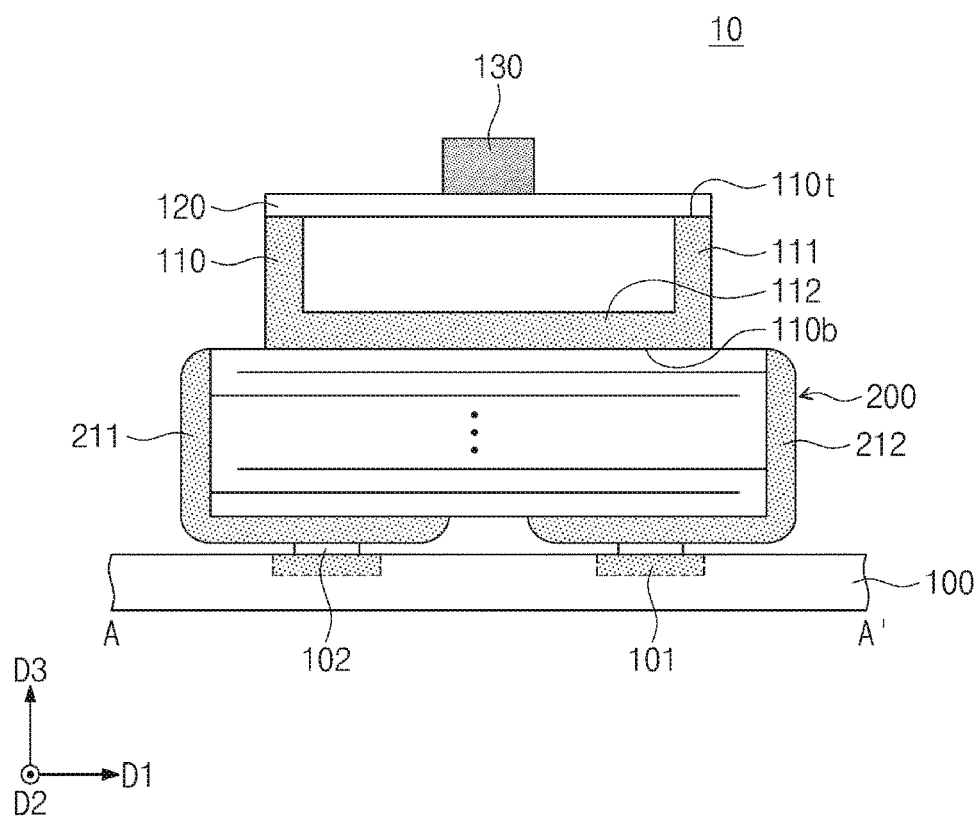
FIG. 2A is a cross-sectional view taken along line A-A' of FIG. 1.
Figure 2B:
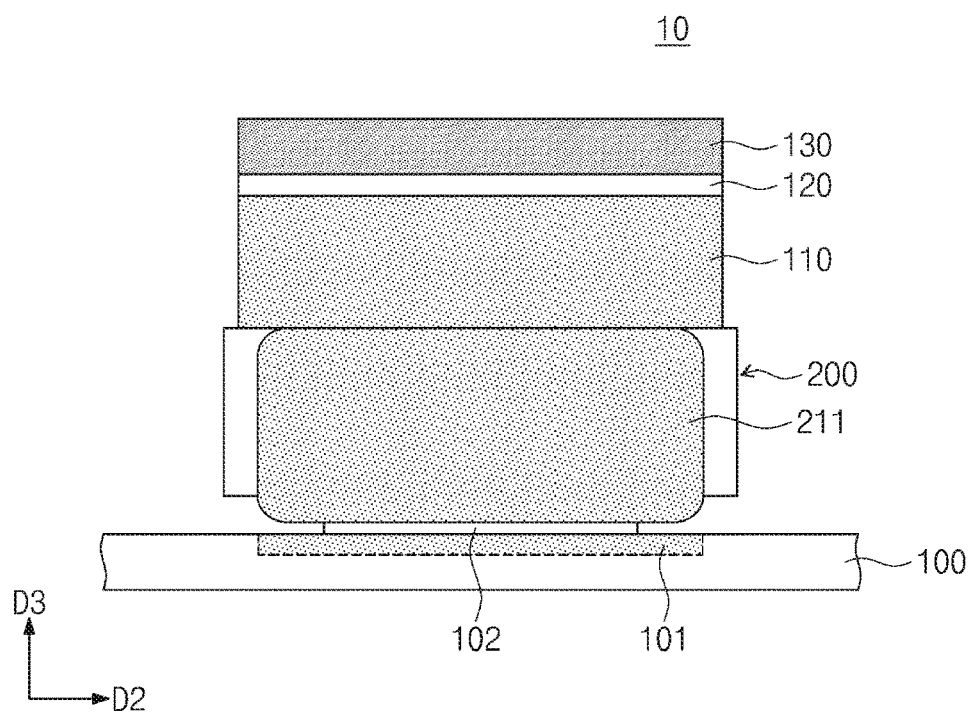
FIG. 2B is a side view of the low frequency actuator device according to the embodiments of the inventive concept.

FIG. 1 is a plan view of a low frequency actuator device when viewed from an upper side according to embodiments of the inventive concept. FIG. 2A is a cross-sectional view taken along line A-A' of FIG. 1. FIG. 2B is a side view of the low frequency actuator device according to the embodiments of the inventive concept.

Referring to FIGS. 1, 2A, and 2B, a low frequency actuator device 10 may include a substrate 100, a support 110, a vibration membrane 120, a vibrating mass 130, and an actuator 200.

The substrate 100 may include a pair of connection electrodes 101. For example, the substrate 100 may expose the pair of connection electrodes 101 through a surface thereof. The pair of connection electrodes 101 may be connected to wiring patterns mounted on the substrate 100. For example, the wiring patterns may be mounted inside the substrate 100. The substrate 100 may include a rigid material or a flexible/stretchable material. For example, the substrate 100 may include at least one of PDMS, elastomer, silicone, Ecoflex, rubber, or urethane.

The actuator 200 may be provided on the pair of connection electrodes 101. The actuator 200 may be electrically connected to the pair of connection electrodes 101 through a conductive adhesive layer 102. For example, the conductive adhesive layer 102 may include at least one of silver epoxy (Ag epoxy), copper epoxy (Cu epoxy), or mixed metal epoxy. A surface of the conductive adhesive layer 102 may be modified to adhere to the pair of connection electrodes 101.

The actuator 200 may include a first side electrode 211 and a second side electrode 212. The first side electrode 211 and the second side electrode 212 may be provided on both side surfaces of the actuator 200. The first side electrode 211 and the second side electrode 212 may be spaced apart from each other in a first direction D1. The first side electrode 211 and the second side electrode 212 may cover portions of side and bottom surfaces of the actuator 200. For example, the first side electrode 211 may cover one side surface and a portion of the bottom surface of the actuator 200, and the second side electrode 212 may cover the other side surface and a portion of the bottom surface of the actuator 200.

The first side electrode 211 and the second side electrode 212 may be electrically connected to the pair of connection electrodes 101 through the conductive adhesive layer 102, respectively. The first side electrode 211 and the second side electrode 212 may be coated with an insulating film. For example, the insulating film may include $SiO_2$ or an organic thin film. Since the insulating film is applied on the first side electrode 211 and the second side electrode 212, electrical short-circuit between elements may be prevented. The actuator 200 may receive an electrical signal through the wiring patterns mounted on the substrate 100 to generate vibration.

A support 110 may be provided on the actuator 200, and the vibration membrane 120 may be provided on the support 110. The support 110 may transmit the vibration of the actuator 200 to the vibration membrane 120. The support 110 may include a metal, ceramic, a semiconductor, a hardened resin, and the like. For example, the support 110 may include at least one of iron (Fe), stainless steel, tungsten (W), tungsten carbide (WC), aluminum (Al), titanium (Ti), molybdenum (Mo), tin (Sn), or copper (Cu).

An area of a top surface 110t of the support 110 contacting the vibration membrane 120 may be equal to or less than that of a bottom surface 110b of the support 110 contacting the actuator 200. Since the area of the top surface 110t of the support 110 is equal to or less than that of the bottom surface 110b of the support 110, contact between the support 110 and the actuator 200 may be facilitated, and the vibration may be better transmitted to the vibration membrane 120. The top surface 110t of the support 110 may contact an edge of the vibration membrane 120. For example, the support 110 may have a U-shaped or ⊓-shaped cross-section.

The support 110 may include first support parts 111 spaced apart from each other. The first support parts 111 may extend from the actuator 200 in a direction of the vibration membrane 120. The first support parts 111 may extend in a third direction D3 perpendicular to a surface defined by the first direction D1 and the second direction D2 crossing the first direction D1. Top surfaces of the first support parts 111 may be the top surface 110t of the support 110. The first support parts 111 may contact the edge of the vibration membrane 120. For example, the first support parts 111 may have the same height.

The support 110 may further include a second support part 112 covering the top surface of the actuator 200. The second support part 112 may cover a portion of the top surface of the actuator 200. The first support parts 111 may extend from a portion of the second support part 112 to contact the vibration membrane 120. For example, the first support parts 111 may extend from a portion of an edge of the second support part 112 to contact the vibration membrane 120. A bottom surface of the second support part 112 may be the bottom surface 110b of the support 110. When the support 110 does not include the second support part 112, the bottom surfaces of the first support parts 111 may be the bottom surface 110b of the support 110.

The vibration membrane 120 may receive the vibration of the actuator 200 through the support 110. The vibration membrane 120 may vibrate according to the vibration of the actuator 200. The vibration membrane 120 may adhere to the support 110. The vibration membrane 120 may include an organic thin film. For example, the vibration membrane 120 may include at least one of PDMS, PMMA, Ecoflex, silicone, urethane, rubber, polyimide (PI), or elastomer. For example, the vibration membrane 120 may be spaced apart from the second support part 112 in the third direction D3.

The vibrating mass 130 may be provided on the vibration membrane 120. The vibrating mass 130 may adhere to the vibration membrane 120. The vibrating mass 130 may include a metal, ceramic, or a semiconductor. For example, the vibrating mass 130 may include at least one of iron (Fe), stainless steel, tungsten (W), tungsten carbide (WC), molybdenum (Mo), lead (Pb), iridium (Ir), palladium (Pd), tantalum (Ta), tin (Sn), indium (In), gold (Au), silver (Ag), or copper (Cu). In addition, for example, the vibrating mass 130 may include an oxide film on a surface thereof.

When the vibrating mass 130 is viewed from an upper side , the vibrating mass 130 may have various shapes such as a circular, elliptical, polygonal, or cross (+) shape. For example, the vibrating mass 130 may have a shape of a regular hexahedral shape, a rectangular parallelepiped shape, a tetrahedral shape, a cylindrical shape, an elliptical column shape, a hemispherical shape, a triangular column shape, or an octagonal column shape.

An area of the portion of the vibrating mass 130, which contacts the vibration membrane 120 may be less than that of the vibration membrane 120. An area of one surface of the vibrating mass 130 may be less than that of the vibration membrane 120. The vibrating mass 130 may contact a portion of the vibration membrane 120. An area of the bottom surface of the vibrating mass 130, which contacts the vibration membrane 120, may be less than that of the vibration membrane 120.

Since the vibration membrane 120 and the vibrating mass 130 are provided on the actuator 200, the low frequency vibrating actuator device 10 may output low frequency vibration. The actuator 200 may generally have a resonant frequency of several hundreds kHz or more. However, since the vibration membrane 120 and the vibrating mass 130 are provided above the actuator 200, the low frequency vibrating actuator device 10 may output low frequency vibration of about 500 Hz or less, at which the human body is capable of feeling the vibration, even though the resonant frequency decreases. For example, the resonant frequency of the actuator 200 may be greater than that of the vibrating mass 130, and the resonant frequency of the vibrating mass 130 may be about 500 Hz or less.

Figure 3:
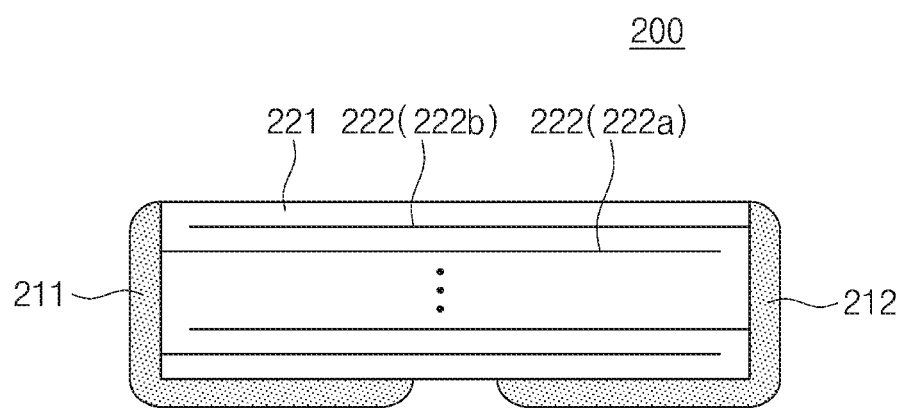
FIG. 3 is a cross-sectional view illustrating the inside of an actuator of the low frequency actuator device according to the embodiments of the inventive concept.

FIG. 3 is a cross-sectional view illustrating the inside of the actuator of the low frequency actuator device according to the embodiments of the inventive concept.

Referring to FIG. 3, the actuator 200 may include first and second side electrodes 211 and 212, insulating layers 221, and internal electrodes 222.

The insulating layers 221 may be provided in plurality and laminated inside the actuator 200. The insulating layers 221 may include at least one of a piezoelectric element or an electrostrictive element. The insulating layers 221 may be piezoelectric thin films. For example, the insulating layers 221 include at least one of PZT, PLZT, PMN-PT, PYN-PT, PIN-PT, ZnO, CdS, AlN, BaTiO$_3$, PbTiO$_3$, LiNbO$_3$, LiTaO$_3$, BNT, PVDF, P(DVF-TrFE), P(VDF-TrFE-CFE), P(VDF-TrFE-CTFE), P(VDF-HFP), PVDF-TFE, PVC, PAN, PPEN, or Polyamides.

The internal electrodes 222 may be alternately laminated between the insulating layers 221 adjacent to each other. The internal electrodes 222 may include first internal electrodes 222a connected to the first side electrode 211 and second internal electrodes 222b connected to the second side electrode 212. The first internal electrodes 222a and the second internal electrodes 222b may be alternately laminated with each other.

The internal electrodes 222 may receive an electrical signal through the first and second side electrodes 211 and 212 to induce the vibration of the actuator 200. For example, each of the first side electrode 211, the second side electrode 212, and the internal electrodes 222 may include at least one of ITO, molybdenum (Mo), nickel (Ni), aluminum (Al), silver (Ag), and palladium (Pd), copper (Cu), gold (Au), Ag/Pd, Ti/Au, Ti/Pt, graphene, CNT, PEDOT, or PEDOT-PSS.

Figure 4A:
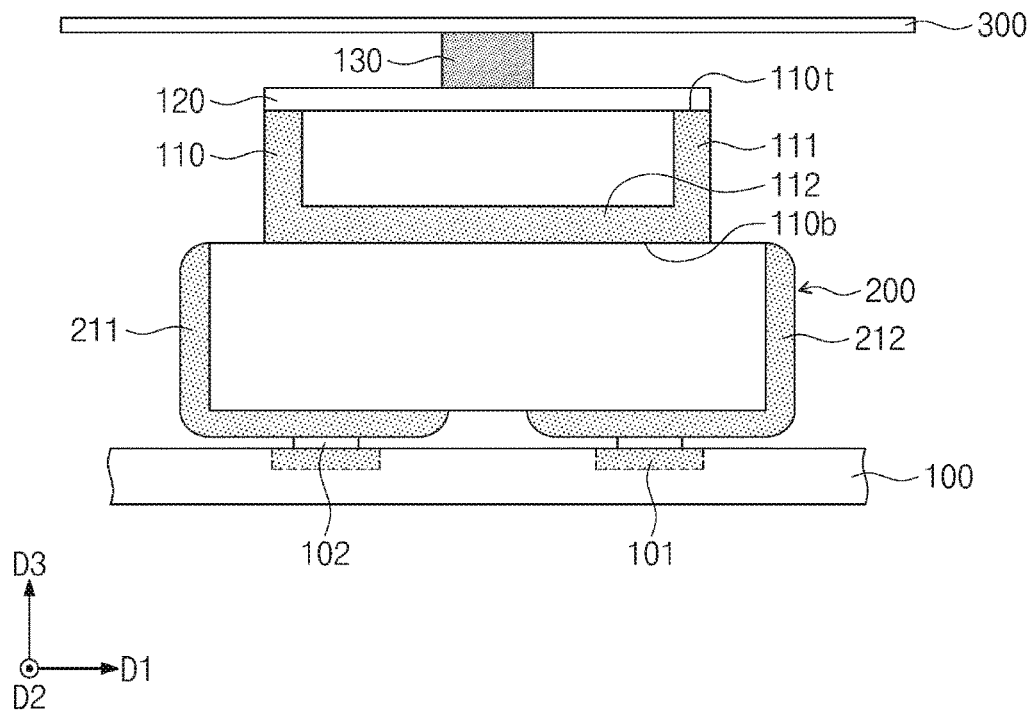
FIGS. 4A and 4B are front and side views of the low frequency actuator device according to the embodiments of the inventive concept.
Figure 4B:
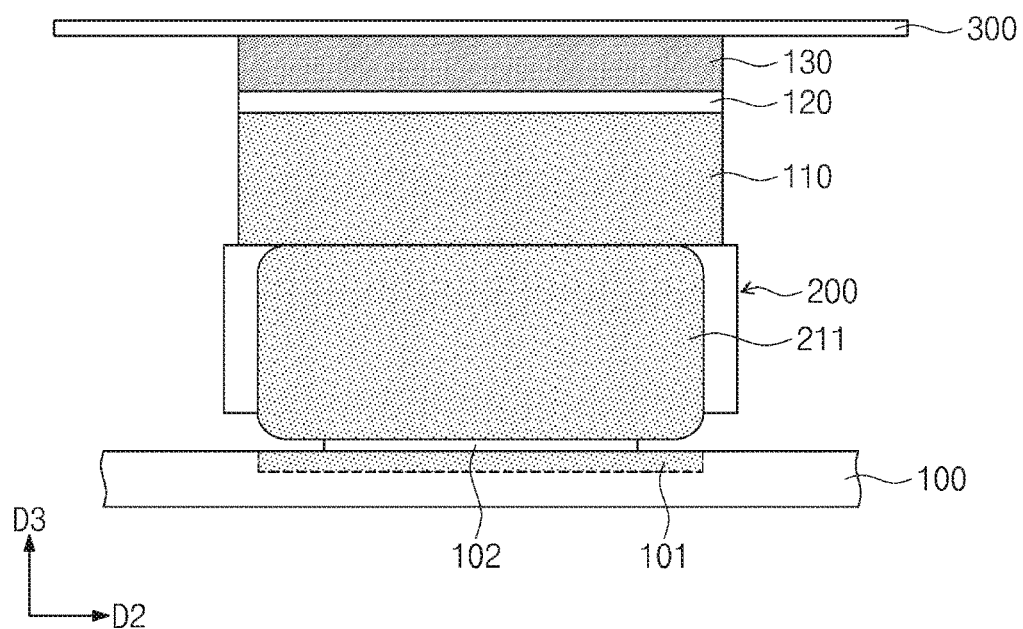

FIGS. 4A and 4B are front and side views of the low frequency actuator device according to the embodiments of the inventive concept.

Referring to FIGS. 4A and 4B, the low frequency vibrating actuator device 10 according to embodiments of the inventive concept may further include a protective layer 300. The protective layer 300 may be provided on the vibrating mass 130. The protective layer 300 may function to block direct contact of the human body and protect the low frequency vibrating actuator device 10 from an external impact or foreign substances. The protective layer 300 may include an organic thin film having elasticity so that the vibration is transmitted to the human body. For example, the protective layer 300 may include at least one of PDMS, Ecoflex, elastomer, silicone, rubber, urethane, or polyimide (PI).

Figure 4C:
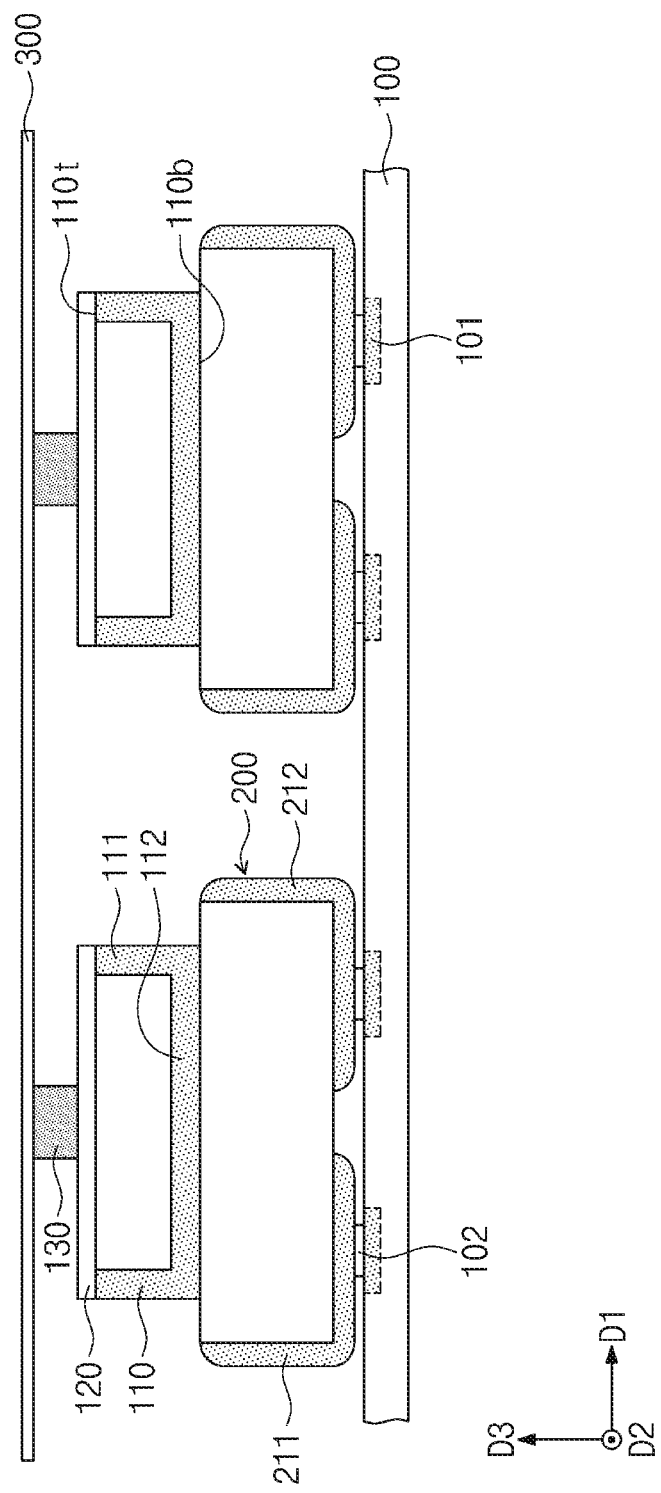
FIG. 4C is a front view of the low frequency actuator device according to the embodiments of the inventive concept.

FIG. 4C is a front view of the low frequency actuator device according to the embodiments of the inventive concept. Referring to FIG. 4C, a plurality of actuators 200 and a vibrating mass 130 may be provided on the substrate 100. For example, one protective layer 300 may be provided on the plurality of vibrating masses s 130.

Figure 5:
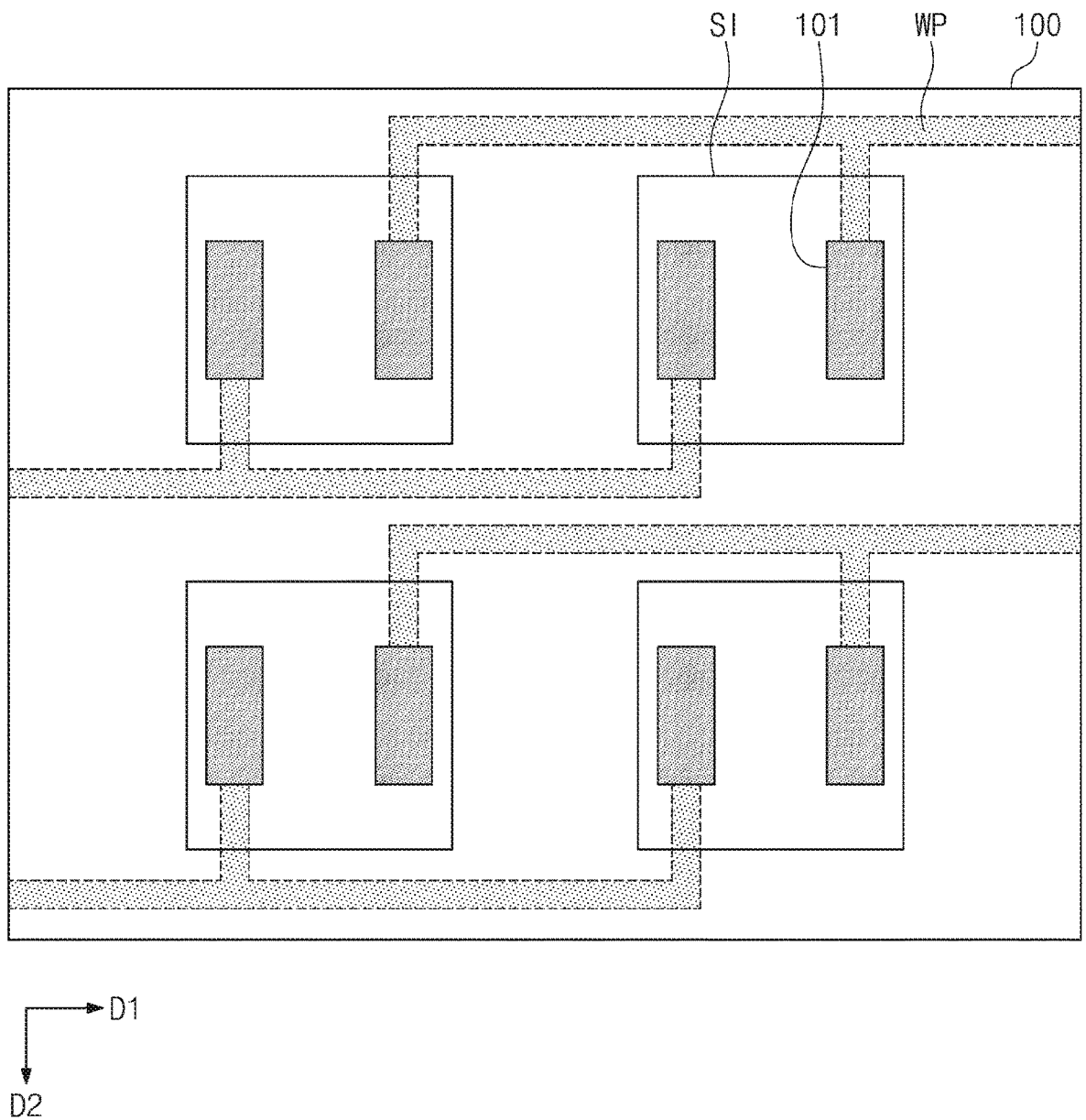
FIG. 5 is a plan view illustrating a substrate of the low frequency actuator device when viewed from the upper side according to embodiments of the inventive concept.

FIG. 5 is a plan view illustrating the substrate of the low frequency actuator array device when viewed from the upper side according to embodiments of the inventive concept.

Referring to FIG. 5, the substrate 100 may include wiring patterns WP. The wiring patterns WP may be connected to the pair of connection electrodes 101. For example, the wiring patterns WP may be mounted inside the substrate 100. As illustrated in FIG. 4C, the plurality of actuators 200 may be provided on the substrate 100. For example, the wiring patterns WP may be provided in the form of a passive electrical addressing circuit matrix or an active electrical addressing circuit matrix. The wiring patterns WP may be electrically connected to the actuators 200 through the pair of connection electrodes 101. Accordingly, each of the actuators 200 may individually receive a signal to output various types of vibration signals.

The substrate 100 may include structures SI that support the actuator 200. The structures SI may expose the pair of connection electrodes 101 on surfaces thereof. Each of the structures SI may have a stiff island structure. The structures SI may be areas having an elastic modulus greater than that of other areas of the substrate 100 except for the structures SI that support the actuator 200. The substrate 100 may include structures SI, each of which has a high elastic modulus. The structures SI may be connected to each other through a thin film which has elasticity. The thin film may include the pair of connection electrodes 101 inside. Alternatively, since the wiring patterns WP have a serpentine pattern with a ribbon structure, the structures SI may be connected to each other with a serpentine structure wiring pattern WP. For example, when the wiring patterns WP are provided in the form of an active electrical addressing circuit matrix, a driving circuit including a thin film transistor (TFT) may be provided inside the structures SI.

Figure 6A:
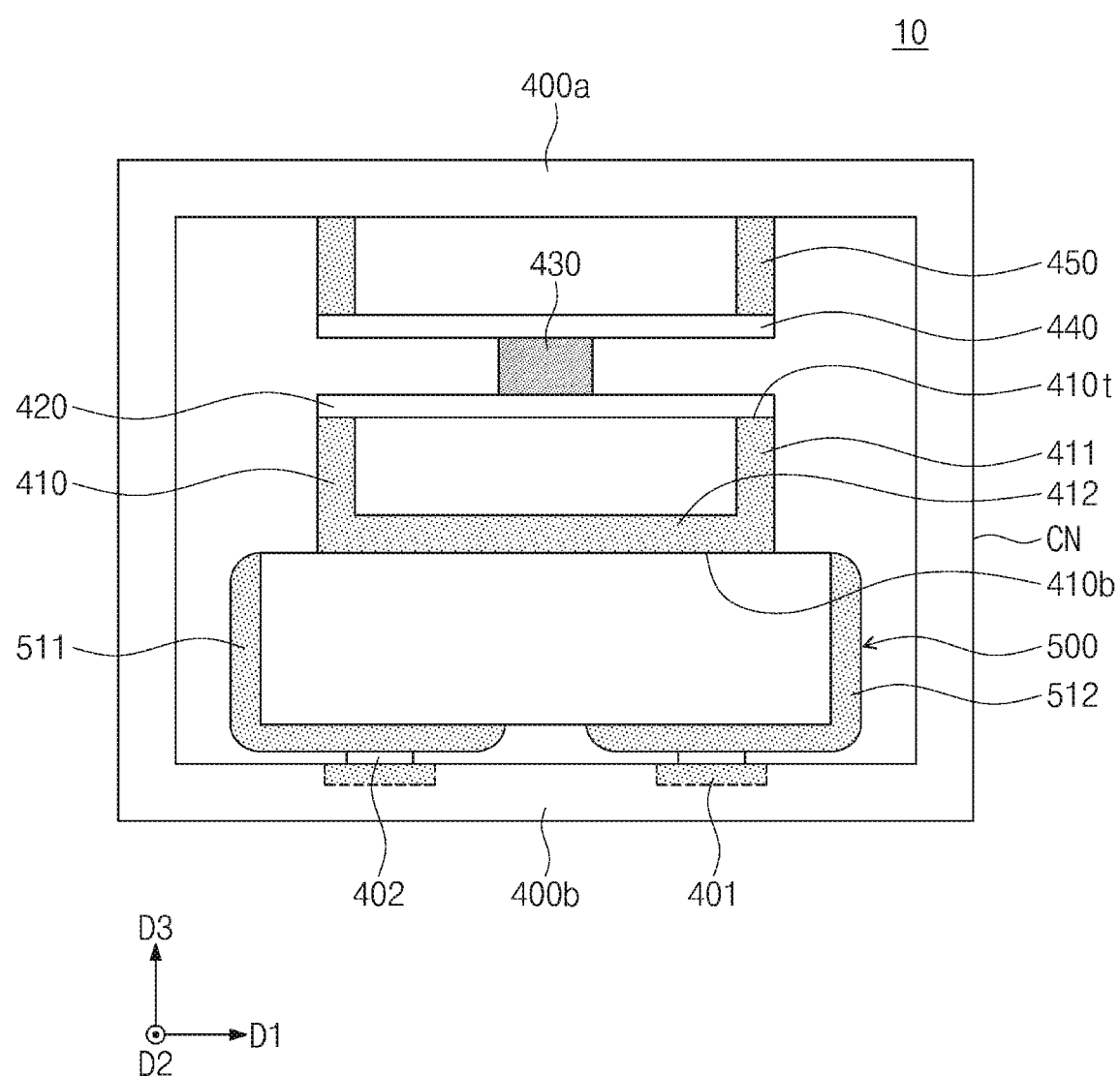
FIGS. 6A and 6B are front and side views of the low frequency actuator device according to the embodiments of the inventive concept.
Figure 6B:
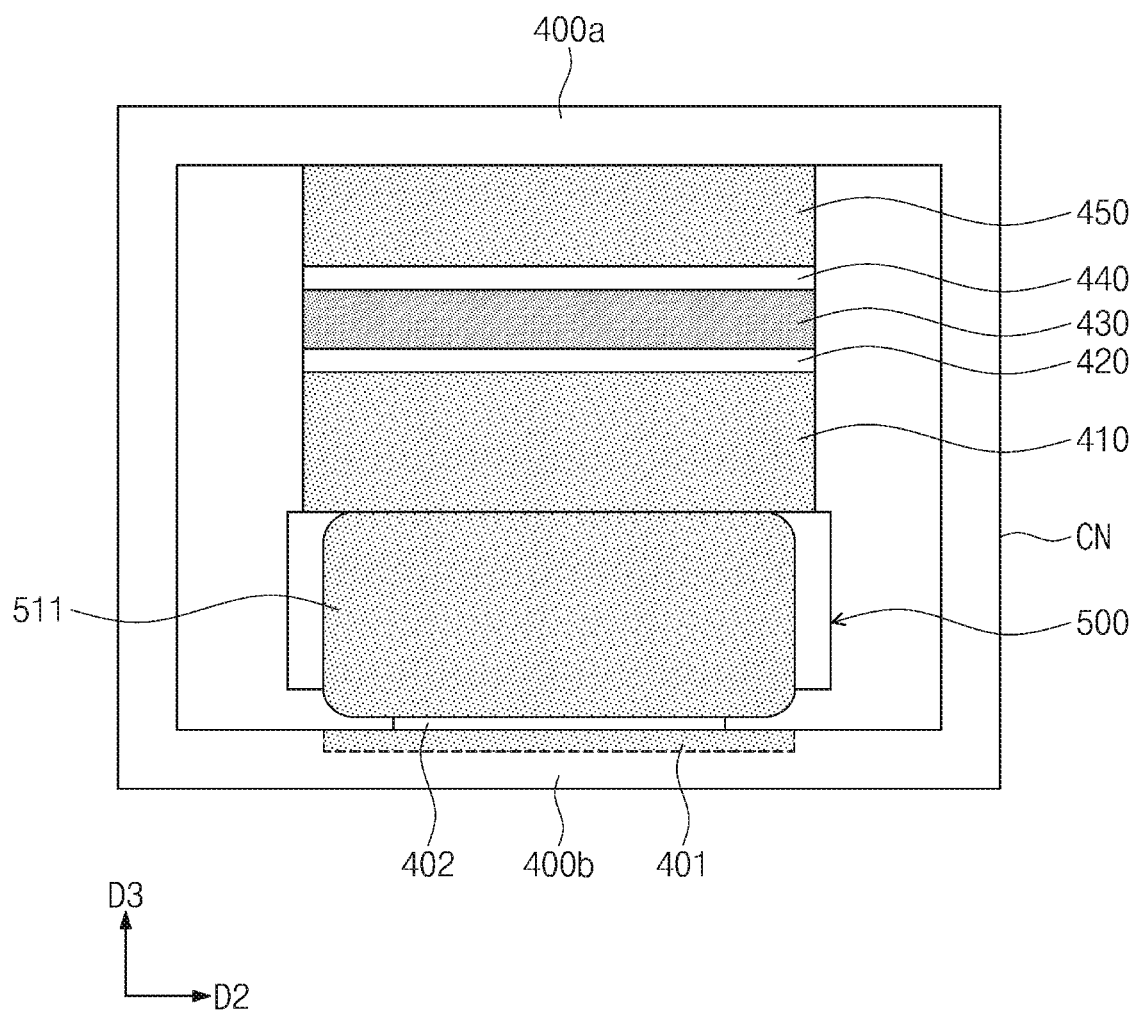

FIGS. 6A and 6B are front and side views of the low frequency actuator device according to the embodiments of the inventive concept.

Referring to FIGS. 6A and 6B, the low frequency vibrating actuator device 10 includes an upper substrate 400a, a lower substrate 400b, a first support 410, a first vibration membrane 420, a vibrating mass 430, a second vibration membrane 440, a second support 450, and an actuator 500.

The low frequency vibrating actuator device 10 may include the upper substrate 400a and the lower substrate 400b. The upper substrate 400a and the lower substrate 400b may be connected to each other. For example, the upper substrate 400a and the lower substrate 400b may be connected to each other through a column CN or a wall to form a module.

The upper substrate 400a and the lower substrate 400b may include a rigid material or a flexible material. For example, each of the upper substrate 400a and the lower substrate 400b may include at least one of PDMS, elastomer, silicone, Ecoflex, rubber, or urethane.

The lower substrate 400b may include a pair of connection electrodes 401 therein. The lower substrate 400b may expose the pair of connection electrodes 401 on a surface thereof. For example, the pair of connection electrodes 401 may be connected to wiring patterns mounted inside the lower substrate 400b.

The actuator 500 may be provided on the lower substrate 400b and electrically connected to the pair of connection electrodes 401 through a conductive adhesive layer 402. The actuator 500 may include a first side electrode 511 and a second side electrode 512.

The first support 410 may be provided on the actuator 500, and the first vibration membrane 420 may be provided on the first support 410. The first support 410 may include, for example, first support parts 411 and second support parts 412. An area of a top surface 410t of the first support 410 contacting the vibration membrane 420 may be equal to or less than that of a bottom surface 410b of the first support 410 contacting the actuator 500.

Since the pair of connection electrodes 401, the conductive adhesive layer 402, the first support 410, the first vibration membrane 420, the vibrating mass 430, and the actuator 500 are substantially the same as the pair of connection electrodes 101, the conductive adhesive layer 102, the first support 110, the vibration membrane 120, the vibrating mass 130, and the actuator 200, their duplicated description will be omitted below.

The second vibration membrane 440 may be provided on the vibrating mass 430. The second vibration membrane 440 may vibrate according to the vibration of the vibrating mass 430. The second vibration membrane 440 may be parallel to the first vibration membrane 420. The second vibration membrane 440 may adhere to the vibrating mass 430. An area of the portion of the vibrating mass 430, which contacts the second vibration membrane 440 may be less than that of the second vibration membrane 440. An area of one surface of the vibrating mass 430 may be less than that of the second vibration membrane 440. The vibrating mass 430 may contact a portion of the second vibration membrane 440.

The second vibration membrane 440 may include an organic thin film. For example, the second vibration membrane 440 may include at least one of PDMS, PMMA, Ecoflex, silicone, urethane, rubber, polyimide (PI), or elastomer. For example, the second vibration membrane 440 may include the same material as the first vibration membrane 420.

The second support 450 may be provided on the second vibration membrane 440. The second support 450 may contact the upper substrate 400a. A top surface of the second support 450 may contact the upper substrate 400a. The second support 450 may be disposed between the second vibration membrane 440 and the upper substrate 400a. A bottom surface of the second support 450 may contact the second vibration membrane 440. The bottom surface of the second support 450 may contact an edge of the second vibration membrane 440. For example, the second support 450 may have an inverted 'U'-shaped or $\Pi$-shaped cross-section. The second support 450 may include a metal, ceramic, a semiconductor, a hardened resin, and the like. For example, the second support 450 may include at least one of iron (Fe), stainless steel, tungsten (W), tungsten carbide (WC), aluminum (Al), titanium (Ti), molybdenum (Mo), tin (Sn), or copper (Cu). For example, the second support 450 may include the same material as the first support 420. The low frequency vibrating actuator device 10 may be provided in the form of a module and thus be bonded to various electronic devices.

Figure 7A:
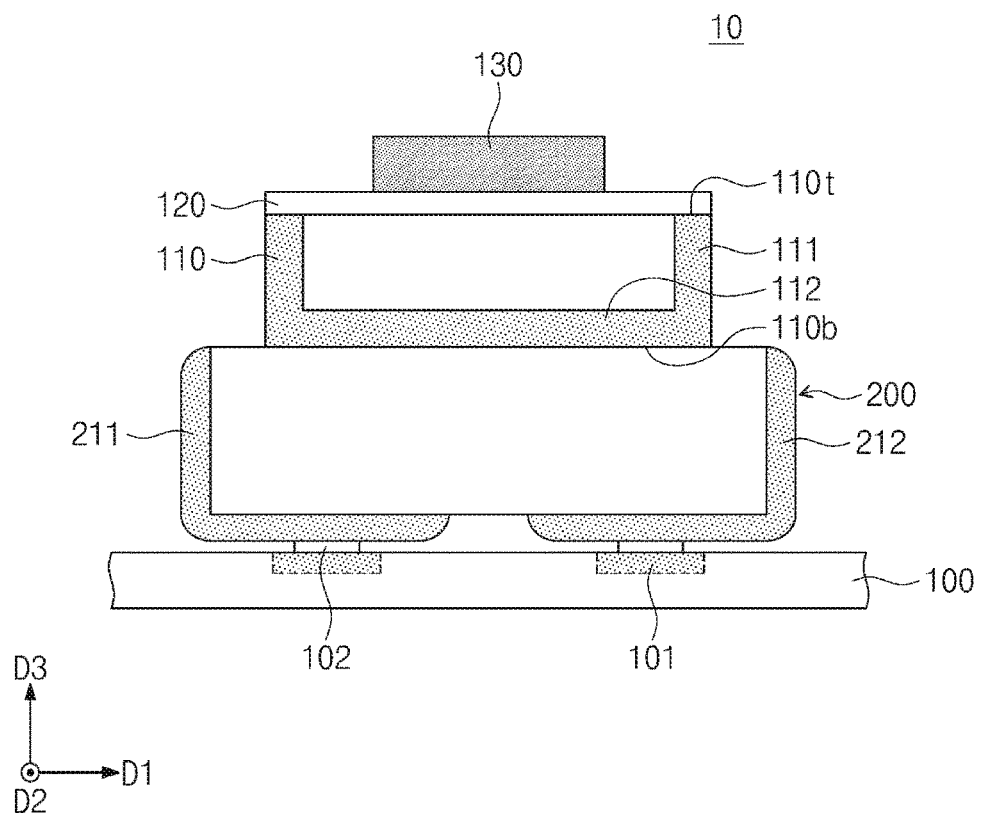
FIGS. 7A, 8A, 9A, 10A, 11A and 12A are front views of the low frequency actuator device according to the embodiments of the inventive concept.
Figure 7B:
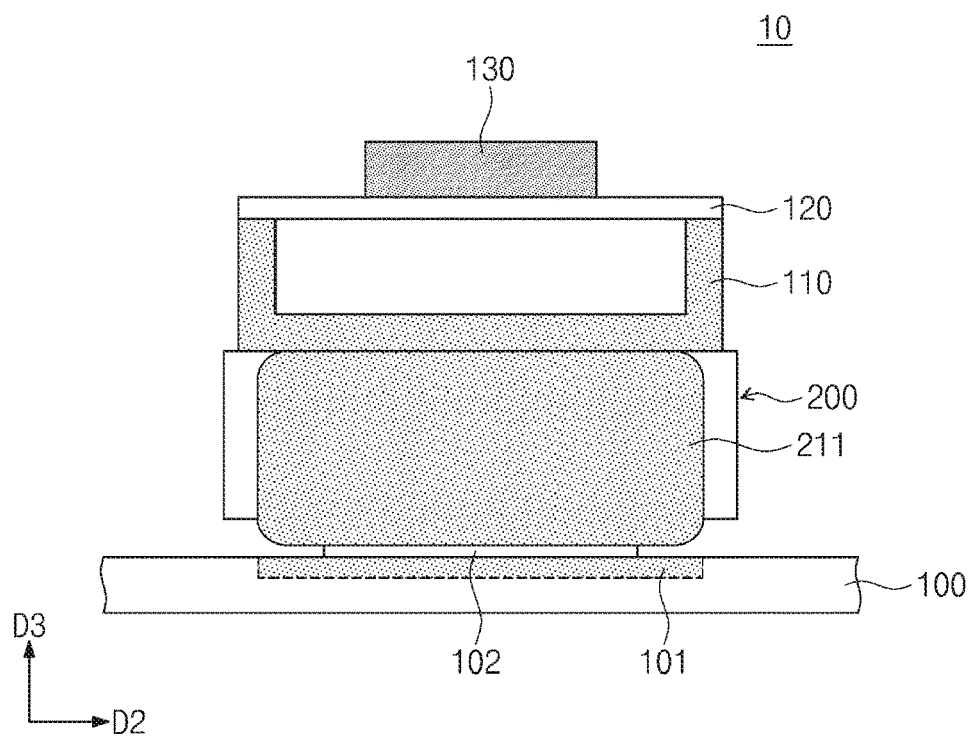
FIGS. 7B and 12B are side views of the low frequency actuator device according to the embodiments of the inventive concept.
Figure 7C:
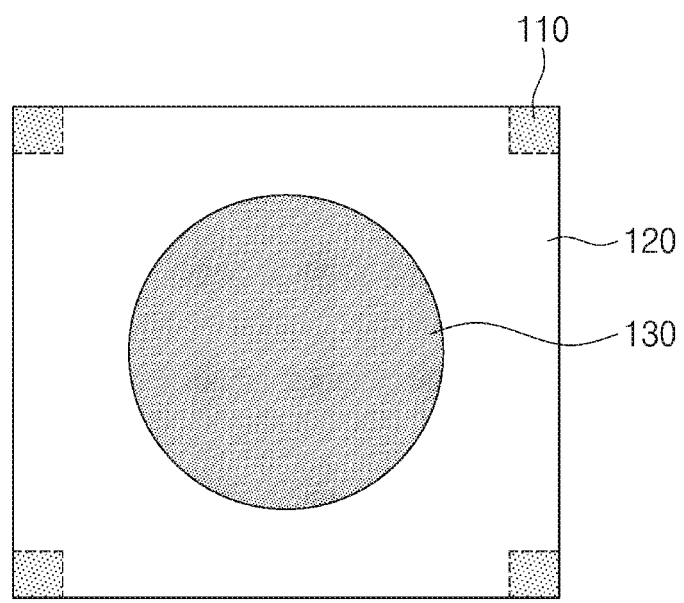
FIGS. 7C, 8B, 9B, 10B, 11B, and 12C are plan views of the low frequency actuator device when viewed from the upper side according to the embodiments of the inventive concept.
Figure 8A:
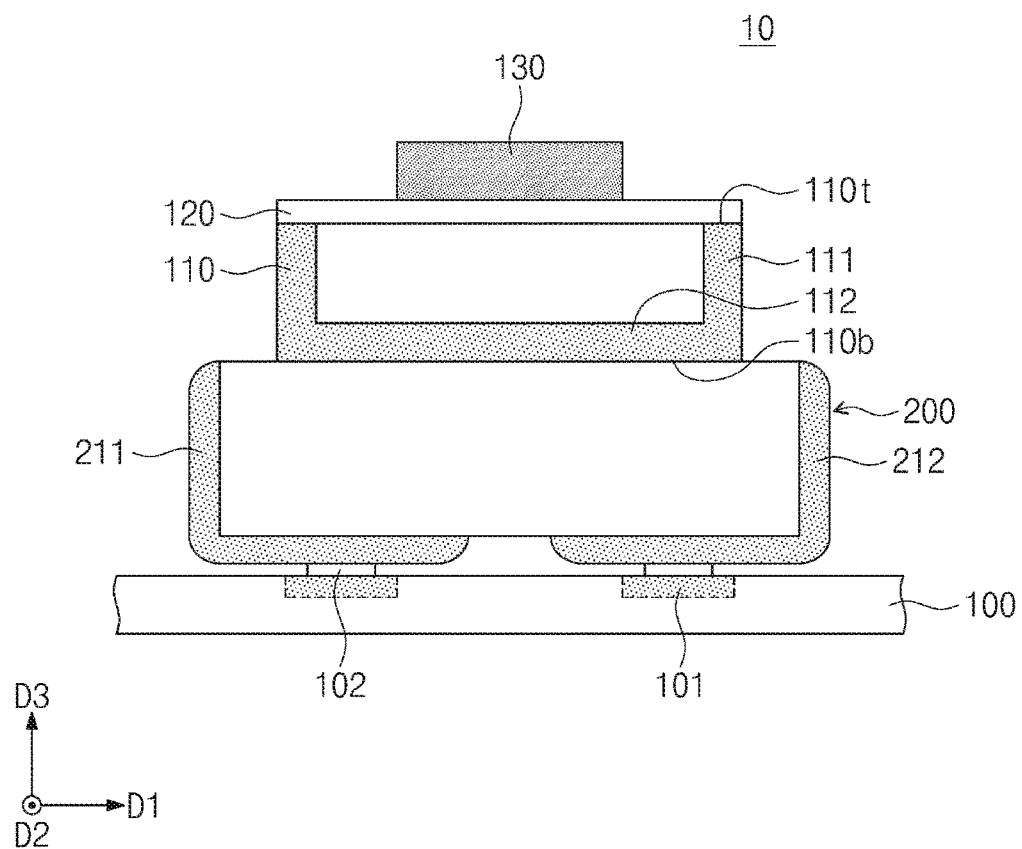
Figure 8B:
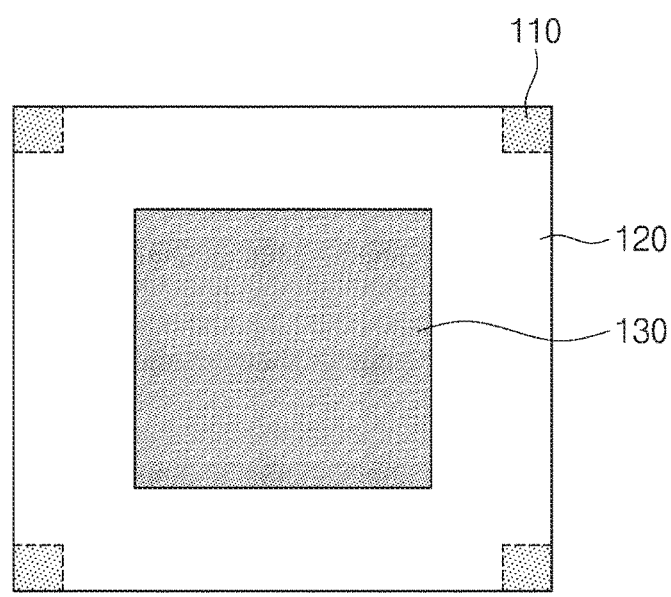
Figure 9A:
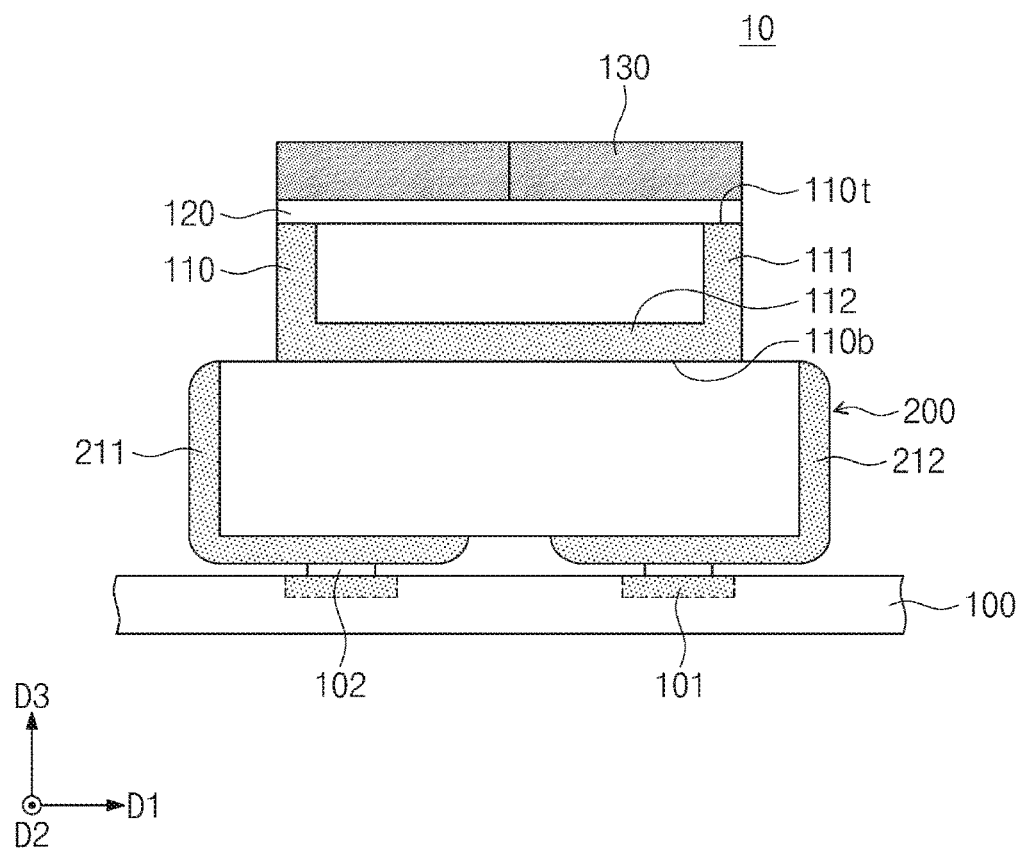
Figure 9B:
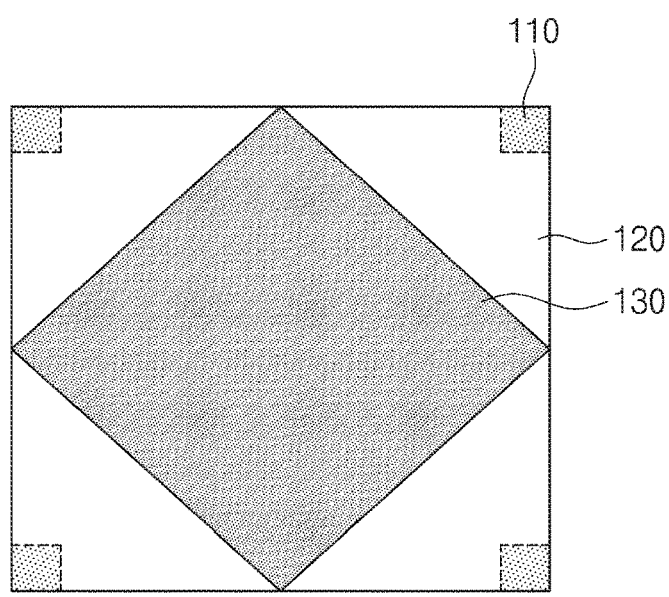
Figure 10A:
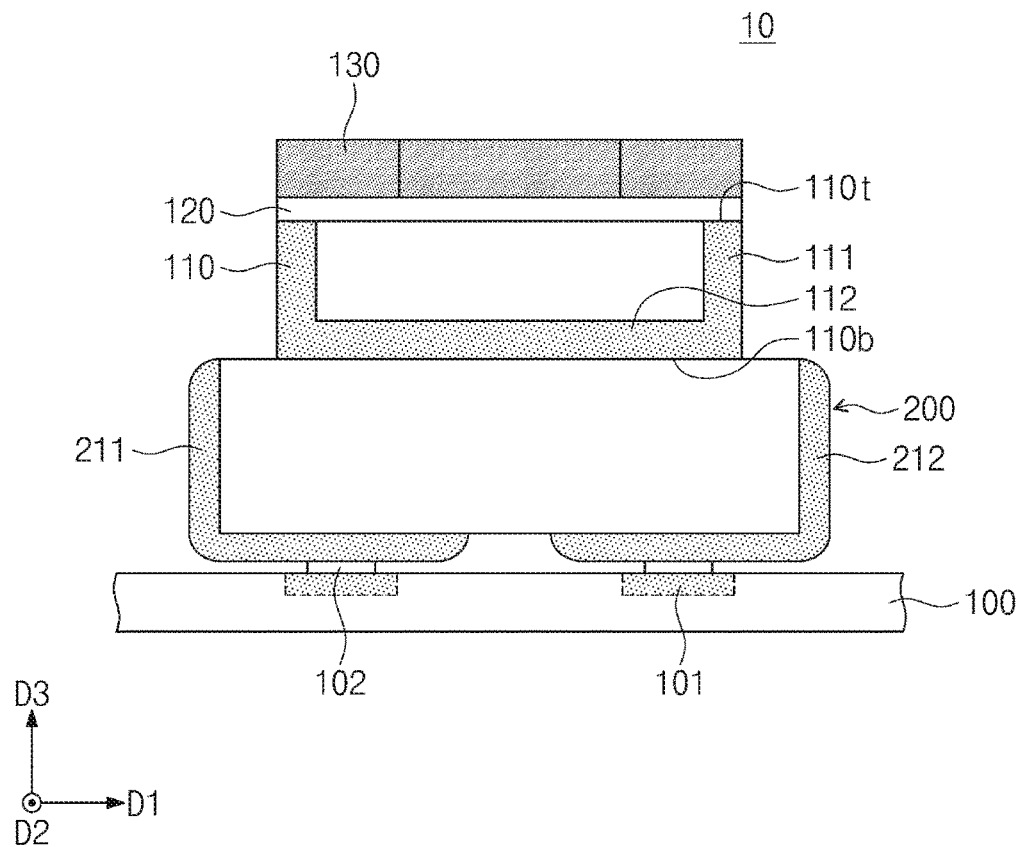
Figure 10B:
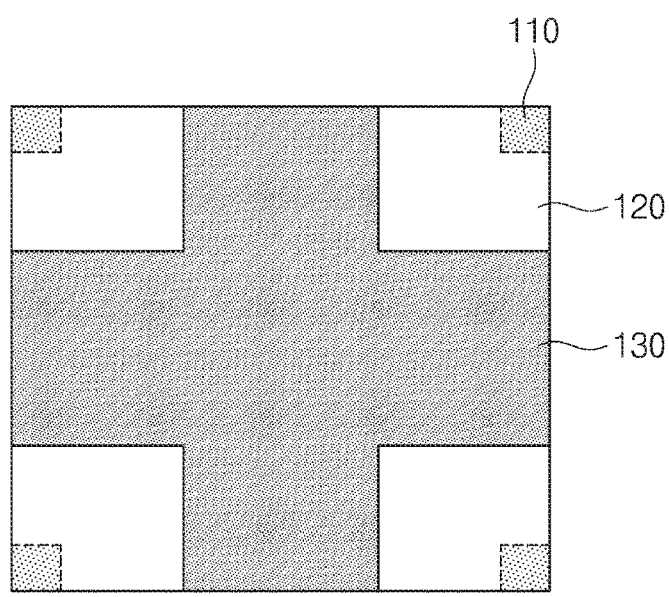
Figure 11A:
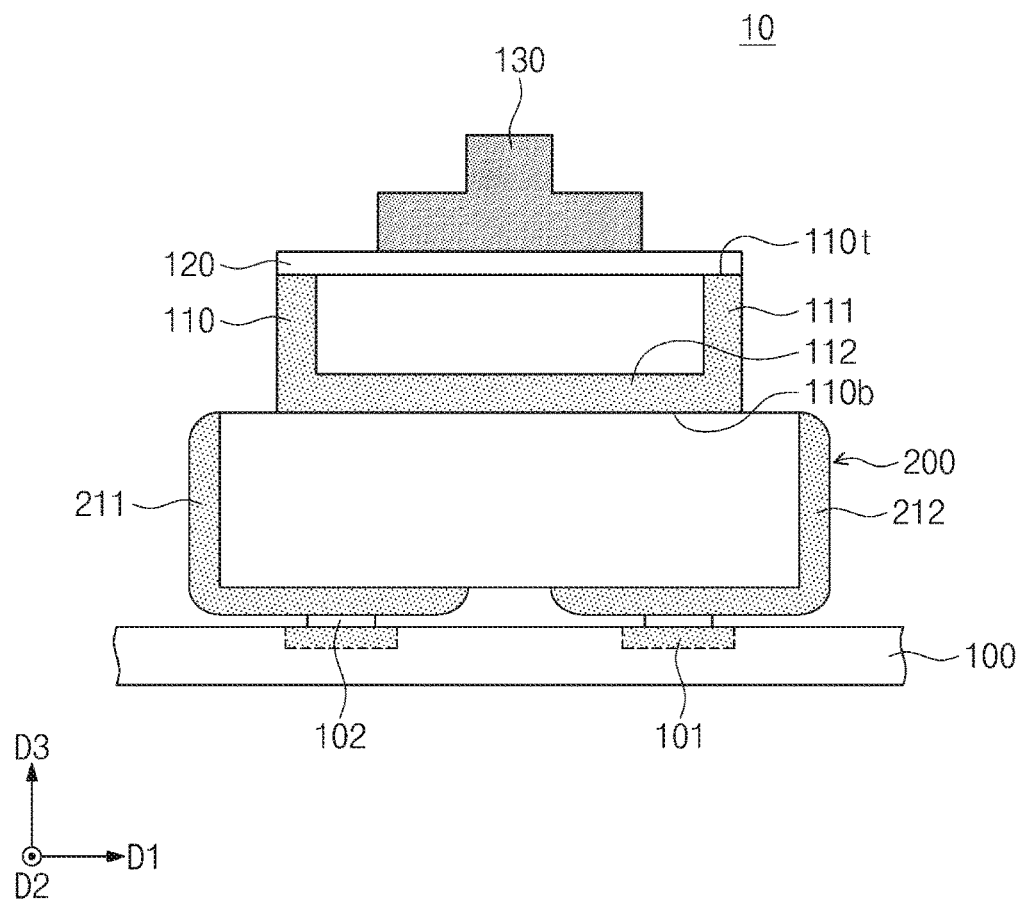
Figure 11B:
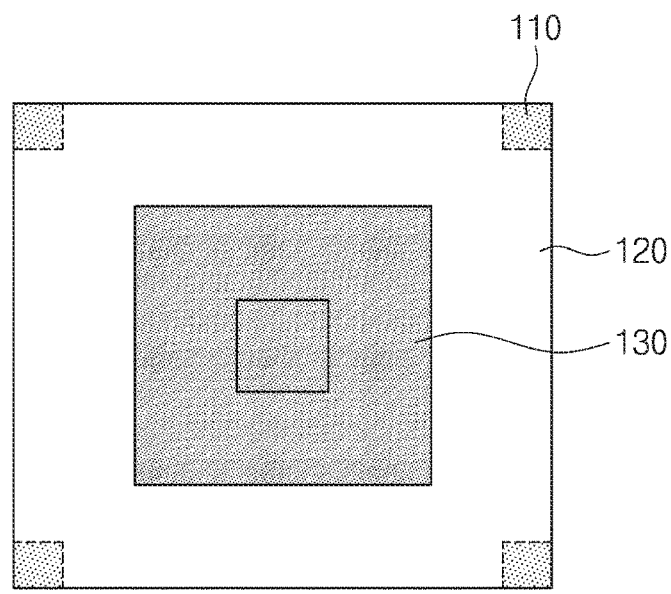

FIGS. 7A, 8A, 9A, 10A, 11A and 12A are front views of the low frequency actuator device according to the embodiments of the inventive concept. FIGS. 7B and 12B are side views of the low frequency actuator device according to the embodiments of the inventive concept. FIGS. 7C, 8B, 9B, 10B, 11B, and 12C are plan views of the low frequency actuator device when viewed from the upper side according to the embodiments of the inventive concept. In FIGS. 7C, 8B, 9B, 10B, 11B, and 12C, some components are omitted for brevity.

Referring to FIGS. 7A to 11B, the vibrating mass 130 may have various shapes. For example, the support 110 may include first support parts 111 which are spaced apart from each other and second support part 112, and may have a shape in which the first support parts 111 respectively contact vertex portions of the vibration membrane 120. For example, the vibrating mass 130 may have a cylindrical shape, a square column shape, a rhombic columnar shape, a cross (+) shape, or a tower shape.

Figure 12A:
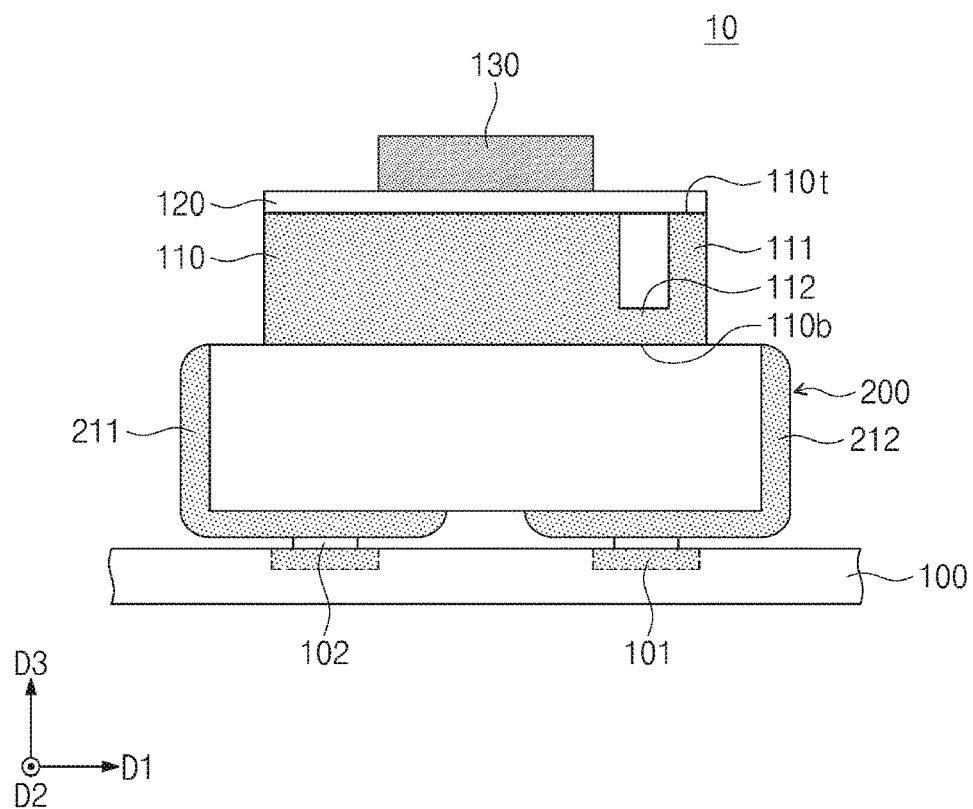
Figure 12B:
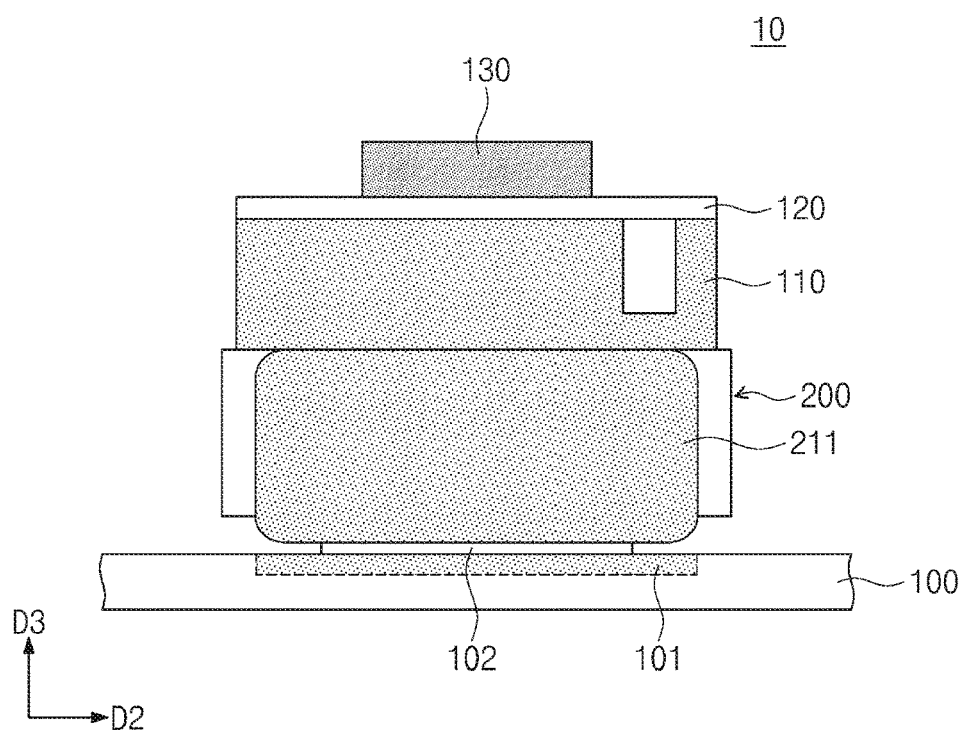
Figure 12C:
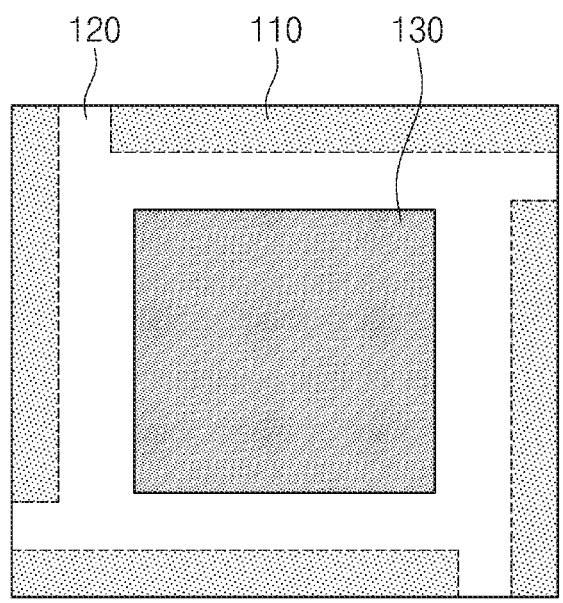

Referring to FIGS. 12A to 12C, the support 120 may include first support parts 111 which are spaced apart from each other and second support part 112. For example, the first support parts 111 may contact an edge portion of the vibration membrane 120. Here, a portion of one side of the vibration membrane 120, which contact with the first support parts 111, may be more than a portion of the one side of the vibration membrane 120, which do not contact with the first support parts 111. For example, the vibrating mass 130 may have the square column shape.

Following <Experimental Example 1> to <Experimental Example 5> are experimental examples for the low frequency vibrating actuator device according to the embodiments of the inventive concept.

Experimental Example 1

In this experimental example, the actuator 200 of the low frequency vibrating actuator device 10 has a size of about 5 mm×5 mm×2 mm (width×length×height). Each of the insulating layers 221 inside the actuator 200 is made of PZT and has a thickness of 50 μm, and the insulating layers 221 are laminated in 40 layers. The support 110 is made of tungsten carbide (WC), has a U-shaped cross-section, and has a height of about 1.3 mm. The vibration membrane 120 is made of PDMS and has a thickness of about 200 μm. The vibrating mass 130 is made of tungsten carbide (WC), has a rectangular parallelepiped shape, and has a size of about 2 mm×5 mm×2 mm. The top surface 110*t* of the support 110 contacting the vibration membrane 120 has a width of about 500 μm.

An electric signal was applied to the low frequency vibrating actuator device 10 to measure vibration displacement spectrum of the vibrating mass 130.

When the electric signal is applied to the low frequency vibrating actuator device 10, after polarities of the insulating layers 221 are aligned, if an electric field is applied in an opposite direction, the alignment of the polarities may be reversed to deteriorate performance. An offset was applied to the electrical signal so that the performance of the low frequency vibrating actuator device 10 is not deteriorated. Accordingly, a sine wave having an intensity of about 15 V was applied to both ends of the actuator 200. Here, the sine wave was set with 15 V upward offset so that an AC voltage of about 0 V to about 30 V is applied. The vibration displacement of the vibrating mass 130 according to the frequency was measured at an interval of about 1 Hz from about 200 Hz to about 1 kHz.

Figure 13:
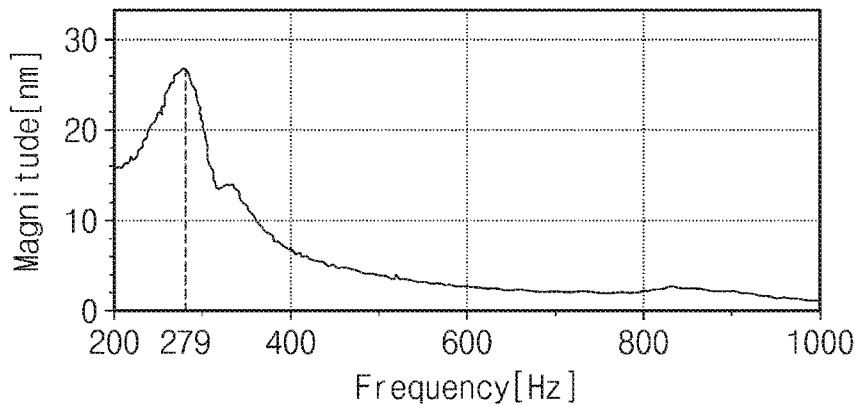
FIG. 13 is a graph illustrating results obtained by measuring vibration displacement characteristics of the vibrating mass depending on a frequency by using a laser vibrometer in <Experimental Example 1>.

FIG. 13 is a graph illustrating results obtained by measuring vibration displacement characteristics of the vibrating mass depending on a frequency by using a laser vibrometer in <Experimental Example 1>. Referring to FIG. 13, the vibration displacement spectrum has a maximum value at a frequency of about 279 Hz. In the vibration displacement of the vibration displacement spectrum, a low absolute value of the vibration displacement may be measured due to scan mode characteristics of the measurement equipment. When a sine wave having a single frequency is input, the vibration displacement spectrum may have a vibration displacement of at least about 40 times. This may be also applied to vibration displacement spectrum in <Experimental Example 2> and <Experimental Example 3>, which will be described later.

Experimental Example 2

In this experimental example, the actuator 200 of the low frequency vibrating actuator device 10 has a size of about 3 mm×3 mm×2 mm (width×length×height). Each of the insulating layers 221 inside the actuator 200 is made of PZT and has a thickness of 50 μm, and the insulating layers 221 are laminated in 40 layers. The support 110 is made of tungsten carbide (WC), has a U-shaped cross-section, and has a height of about 0.9 mm. The vibration membrane 120 is made of PDMS and has a thickness of about 200 μm. The vibrating mass 130 is made of tungsten carbide (WC), has a rectangular parallelepiped shape, and has a size of about 1 mm×3 mm×1 mm. The top surface 110*t* of the support 110 contacting the vibration membrane 120 has a width of about 400 μm.

A sine wave having an intensity of about 15 V was applied. Here, the sine wave was set with 15 V upward offset so that an AC voltage of about 0 V to about 30 V is applied. The vibration displacement of the vibrating mass 130 according to the frequency was measured at an interval of about 1 Hz from about 200 Hz to about 1 kHz.

Figure 14:
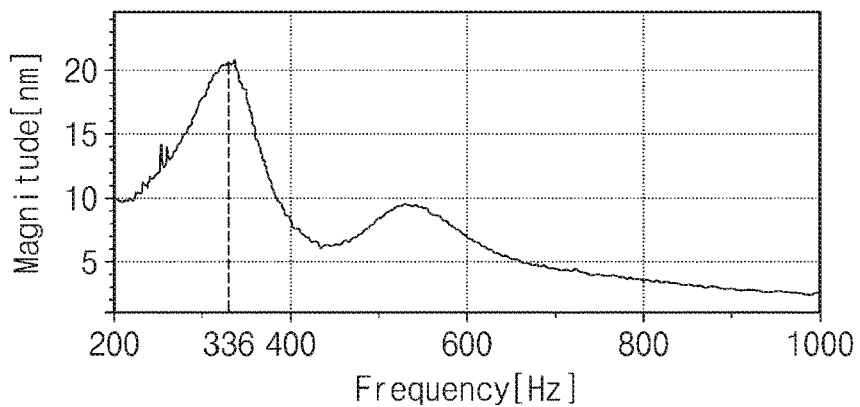
FIG. 14 is a graph illustrating results obtained by measuring vibration displacement characteristics of the vibrating mass depending on a frequency by using the laser vibrometer in <Experimental Example 2>.

FIG. 14 is a graph illustrating results obtained by measuring vibration displacement characteristics of the vibrating mass depending on a frequency by using the laser vibrometer in <Experimental Example 2>. Referring to FIG. 14, the vibration displacement spectrum has a maximum value at a frequency of about 336 Hz.

Referring to <Experimental Example 1> and <Experimental Example 2>, since the vibration membrane 120 and the vibrating mass 130 are provided on the actuator 200, the resonant frequency may be lowered to about 500 Hz or less, and the low frequency vibrating actuator device 10 may output low frequency vibration that is capable of being sensed by a human body.

Experimental Example 3

In this experimental example, the actuator 200 of the low frequency vibrating actuator device 10 has a size of about 2 mm×2 mm×2 mm (width×length×height). Each of the insulating layers 221 inside the actuator 200 is made of PZT and has a thickness of 50 μm, and the insulating layers 221 are laminated in 40 layers. The support 110 is made of tungsten carbide (WC), has a U-shaped cross-section, and has a height of about 0.7 mm. The vibration membrane 120 is made of PDMS and has a thickness of about 100 μm. The vibrating mass 130 is made of tungsten carbide (WC), has a rectangular parallelepiped shape, and has a size of about 0.7 mm×2 mm×0.7 mm. The top surface 110*t* of the support 110 contacting the vibration membrane 120 has a width of about 300 μm.

A sine wave having an intensity of about 15 V was applied. Here, the sine wave was set with 15 V upward offset so that an AC voltage of about 0 V to about 30 V is applied. The vibration displacement of the vibrating mass 130 according to the frequency was measured at an interval of about 6 Hz from about 200 Hz to about 10 kHz.

Figure 15:
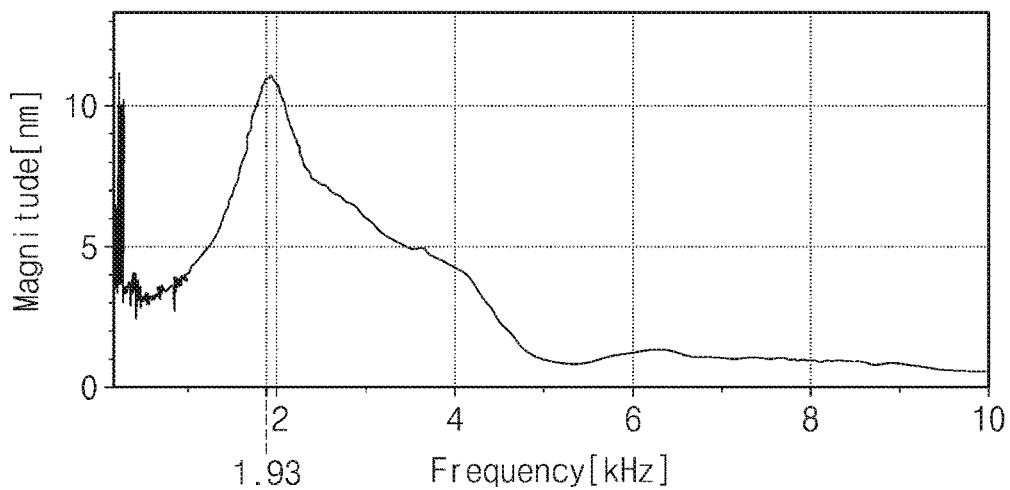
FIG. 15 is a graph illustrating results obtained by measuring vibration displacement characteristics of the vibrating mass depending on a frequency by using the laser vibrometer in <Experimental Example 3>.

FIG. 15 is a graph illustrating results obtained by measuring vibration displacement characteristics of the vibrating mass depending on a frequency by using the laser vibrometer in <Experimental Example 3>. Referring to FIG. 15, the vibration displacement spectrum has a maximum value at a frequency of about 1,930 Hz. The resonant frequency increases because the low frequency vibrating actuator device 10 decreases in size.

Experimental Example 4

The electrical signal described with reference to FIG. 16 was applied to the low frequency vibrating actuator device 10 having a resonant frequency of about 1 kHz.

Figure 16:
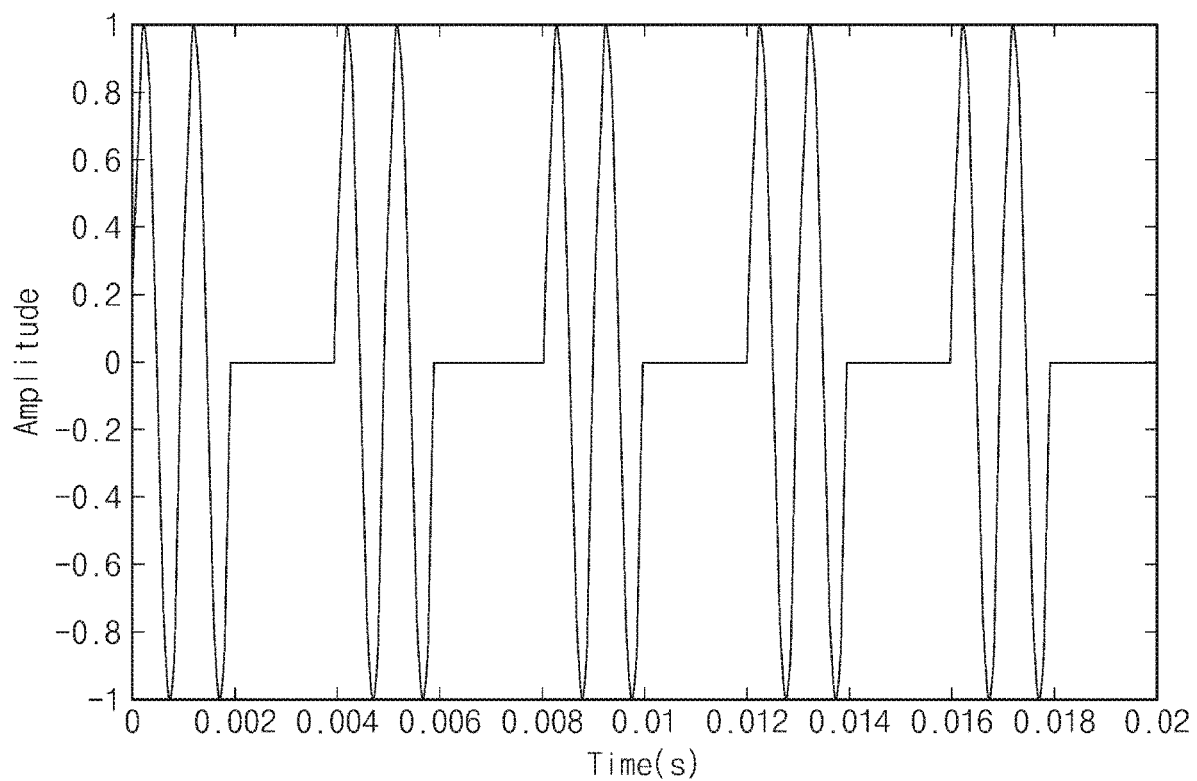
FIG. 16 is a graph illustrating a virtual electrical signal capable of obtaining a modulation frequency of about 250 Hz by applying a voltage with a carrier frequency of about 1 kHz while performing on-off modulation in a period of about 4 ms.
Figure 17:
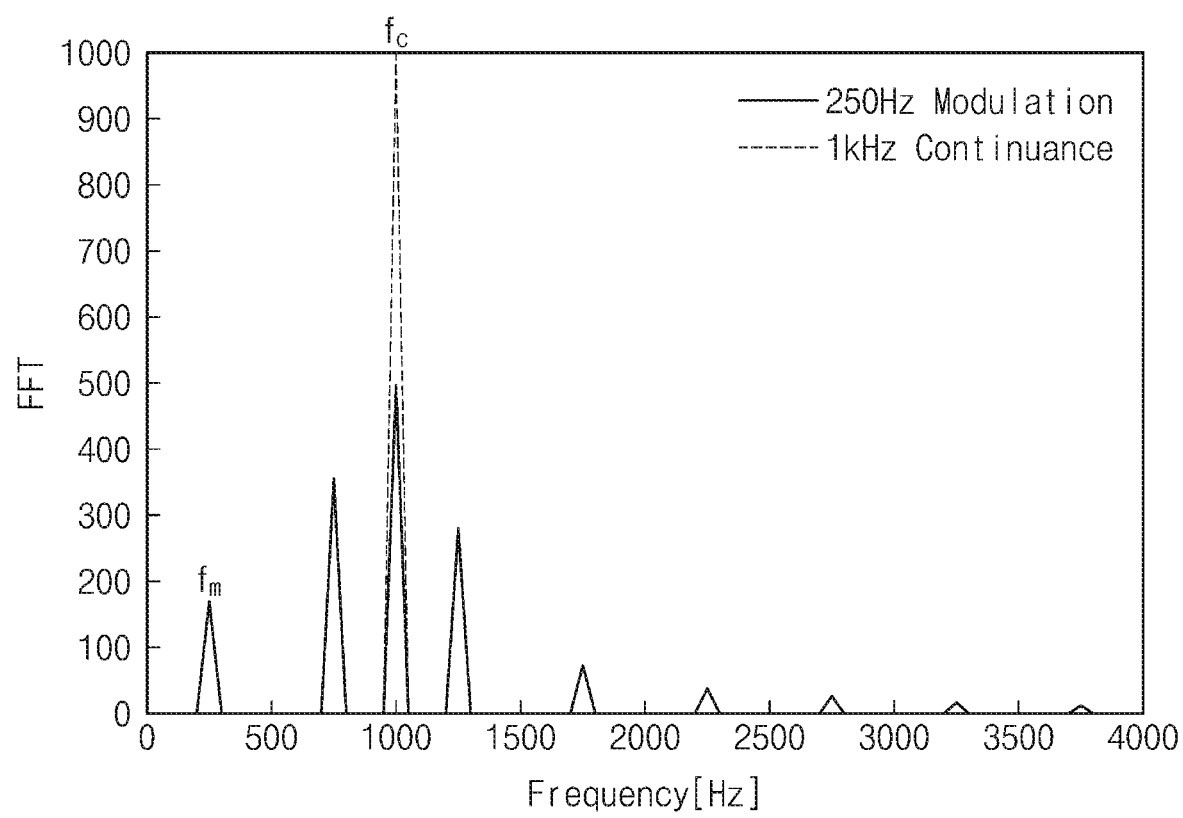
FIG. 17 is a virtual graph illustrating results obtained by performing fast Fourier transform on a vibration displacement signal of the vibrating mass, which is obtained by applying the electrical signal of FIG. 16 and a sine wave electrical signal of about 1 kHz to the low frequency actuator device.

FIG. 16 is a graph illustrating a virtual electrical signal capable of obtaining a modulation frequency of about 250 Hz by applying a voltage with a carrier frequency of about 1 kHz while performing on-off modulation in a period of about 4 ms. FIG. 17 is a virtual graph illustrating results obtained by performing fast Fourier transform on a vibration displacement signal of the vibrating mass, which is obtained by applying the electrical signal of FIG. 16 and a sine wave electrical signal of about 1 kHz to the low frequency actuator device.

Referring to FIG. 17, unlike the case in which the electrical signal having the sine wave with a frequency of about 1 kHz is applied simply, low frequency vibration having a frequency of about 250 Hz, which is well sensed by the human body, was induced through modulation of the electric signal.

Experimental Example 5

In the low frequency vibrating actuator device having the same conditions as in <Experimental Example 3>, a sine wave of an intensity of about 15 V was applied. Here, the sine wave was set with 15 V upward offset so that an AC voltage of about 0 V to about 30 V was applied. A vibration velocity of the vibrating mass depending on a frequency was measured at an interval of about 10 Hz from about 200 Hz to about 3,200 Hz.

Figure 18:
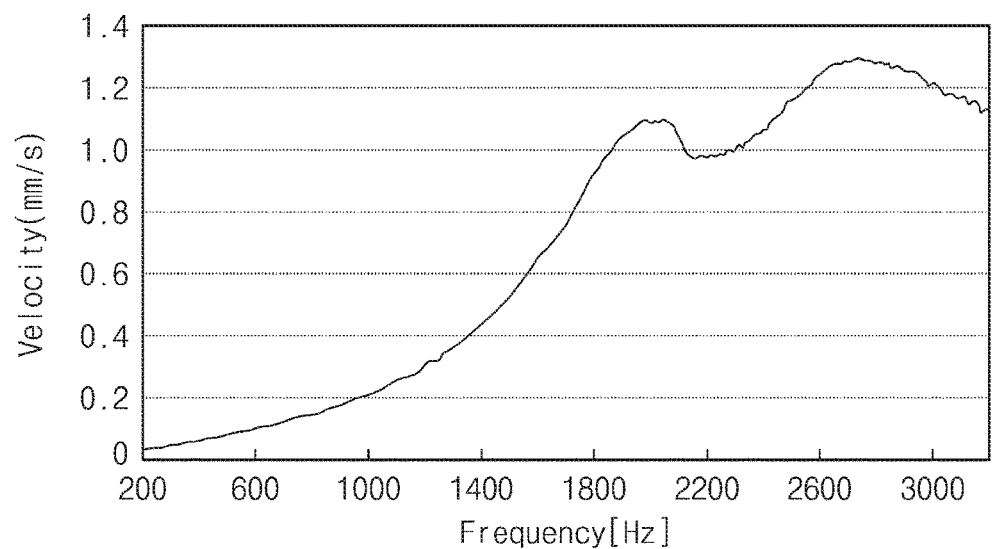
FIG. 18 is a graph illustrating results obtained by measuring a vibration velocity of the vibrating mass depending on a frequency by using the laser vibrometer in <Experimental Example 5>.

FIG. 18 is a graph illustrating results obtained by measuring a vibration velocity of the vibrating mass depending on a frequency by using the laser vibrometer in <Experimental Example 5>. Referring to FIG. 18, since a resonant frequency is 1,930 Hz, a vibration velocity may be low at a frequency of about 250 Hz, and thus, the human body may not sense the vibration.

Figure 19:
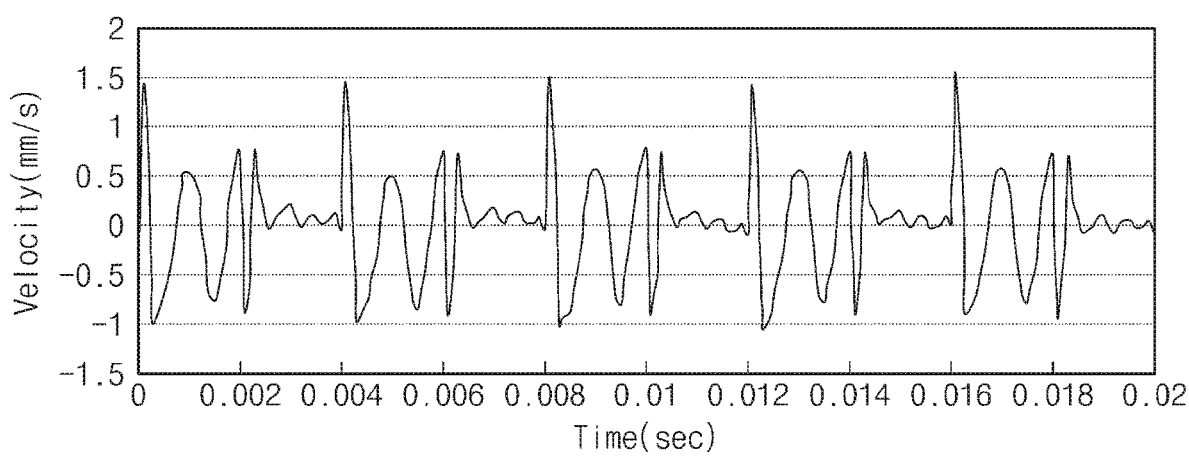
FIG. 19 is a graph illustrating results obtained by measuring a time-varying vibration velocity of the vibrating mass when the electrical signal of FIG. 16 is applied to the low frequency actuator device in <Experimental Example 5>.

FIG. 19 is a graph illustrating results obtained by measuring a time-varying vibration velocity of the vibrating mass when the electrical signal of FIG. 16 is applied to the low frequency actuator device in <Experimental Example 5>. Referring to FIG. 19, in the low frequency vibrating actuator device 10 having a resonant frequency of about 1,930 Hz, a voltage is applied with a carrier frequency of about 1 kHz. Here, an electrical signal is on-off modulated at a period of about 4 ms to generate a vibration output signal having a frequency of about 250 Hz.

In <Experimental Examples 3> to <Experimental Example 5>, it was confirmed that the low frequency vibration having a frequency of about 500 Hz or less is output through the on-off modulation of the electrical signal even when the resonant frequency increases due to the small size of the low frequency vibrating actuator device 10.

In the low frequency vibrating actuator device according to the embodiments of the inventive concept, the vibration membrane and the vibrating mass may be provided to output the low frequency vibration that is capable of being sensed by the human.

The object of the present invention is not limited to the aforesaid, but other objects not described herein will be clearly understood by those skilled in the art from descriptions below.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Thus, the above-disclosed embodiments are to be considered illustrative and not restrictive.

What is claimed is:

1. A low frequency vibrating actuator device comprising:
   a substrate comprising a pair of connection electrodes;
   an actuator provided on the pair of connection electrodes to generate vibration;
   a support provided on the actuator;
   a vibration membrane provided on the support to vibrate according to the actuator; and
   a vibrating mass provided on the vibration membrane to vibrate according to the vibration membrane,
   wherein the actuator comprises a plurality of laminated insulating layers and internal electrodes that are alternately laminated between the insulating layers adjacent to each other, and
   a top surface of the support, which contacts the vibration membrane, has an area that is equal to or less than that of a bottom surface of the support, which contacts the actuator.

2. The low frequency vibrating actuator device of claim 1, wherein the actuator further comprises a first side electrode and a second side electrode, which are electrically connected to the internal electrode, and
   the first and second side electrodes are electrically connected to the pair of connection electrodes, respectively.

3. The low frequency vibrating actuator device of claim 1, wherein the support comprises first support parts spaced apart from each other, and
   the first support parts extend from the actuator to the vibration membrane.

4. The low frequency vibrating actuator device of claim 3, wherein the support further comprises a second support part configured to cover a top surface of the actuator, and
   each of the first support parts extends from a portion of the second support part to contact the vibration membrane.

5. The low frequency vibrating actuator device of claim 1, wherein the top surface of the support contacts an edge of the vibration membrane.

6. The low frequency vibrating actuator device of claim 1, wherein, when the vibrating mass is viewed from an upper side, the vibrating mass has one of a circular shape, an oval shape, a polygonal shape, or a cross (+) shape.

7. The low frequency vibrating actuator device of claim 1, wherein the actuator has a resonant frequency greater than that of the vibrating mass.

8. The low frequency vibrating actuator device of claim 7, wherein the vibrating mass has a resonant frequency of about 500 Hz or less.

9. The low frequency vibrating actuator device of claim 1, wherein the vibration membrane comprises at least one of PDMS, PMMA, Ecoflex, silicone, urethane, rubber, polyimide (PI), or elastomer.

10. The low frequency vibrating actuator device of claim 1, wherein a portion of the vibrating mass, which contacts the vibration membrane, has an area less than that of the vibration membrane.

11. The low frequency vibrating actuator device of claim 1, further comprising a protective layer provided on the vibrating mass.

12. The low frequency vibrating actuator device of claim 1, wherein each of the insulating layers comprises at least one of a piezoelectric element or an electrostrictive element.

13. A low frequency vibrating actuator device comprising:
   a lower substrate comprising a pair of connection electrodes;
   an actuator provided on the pair of connection electrodes to generate vibration;
   a first support provided on the actuator;
   a first vibration membrane provided on the first support;
   a vibrating mass provided on the first vibration membrane;
   a second vibration membrane provided on the vibrating mass;

a second support provided on the second vibration membrane; and an upper substrate provided on the second support, wherein a top surface of the second support contacts the upper substrate, and the actuator has a resonant frequency greater than that of the vibrating mass.

14. The low frequency vibrating actuator device of claim 13, wherein a top surface of the first support, which contacts the first vibration membrane, has an area that is equal to or less than that of a bottom surface of the first support, which contacts the actuator.

15. The low frequency vibrating actuator device of claim 13, wherein the actuator comprises:

a plurality of laminated insulating layers;

internal electrodes that are alternately laminated between the plurality of insulating layers; and a first side electrode and a second side electrode, which are electrically connected to the internal electrodes and the pair of connection electrodes.

16. The low frequency vibrating actuator device of claim 13, wherein the first and second vibration membranes are parallel to each other, and a bottom surface of the second support contacts an edge of the second vibration membrane.

* * * * *